US009207530B2

(12) United States Patent
Dmitriev et al.

(10) Patent No.: US 9,207,530 B2
(45) Date of Patent: Dec. 8, 2015

(54) ANALYSES OF MEASUREMENT DATA

(75) Inventors: Vladimir Dmitriev, Karmiel (IL); Ofir Sharoni, Karkur (Pardess Hanna-Karkur) (IL); Erez Graitzer, Gilon (IL); Igor Varvaruk, Migdal Haemek (IL); Guy Ben-Zvi, Shechania (IL)

(73) Assignee: Carl Zeiss SMS Ltd., Karmiel (IL)

( * ) Notice: Subject to any disclaimer, the term of this patent is extended or adjusted under 35 U.S.C. 154(b) by 541 days.

(21) Appl. No.: 13/579,505

(22) PCT Filed: Feb. 23, 2011

(86) PCT No.: PCT/IB2011/000375

§ 371 (c)(1),
(2), (4) Date: Oct. 18, 2012

(87) PCT Pub. No.: WO2011/104617

PCT Pub. Date: Sep. 1, 2011

(65) Prior Publication Data

US 2013/0028505 A1 Jan. 31, 2013

Related U.S. Application Data

(60) Provisional application No. 61/307,284, filed on Feb. 23, 2010.

(51) Int. Cl.
*G06K 9/00* (2006.01)
*G03F 1/84* (2012.01)
*G03F 7/20* (2006.01)

(52) U.S. Cl.
CPC .............. *G03F 1/84* (2013.01); *G03F 7/70508* (2013.01); *G03F 7/70616* (2013.01); *G03F 7/70625* (2013.01)

(58) Field of Classification Search
None
See application file for complete search history.

(56) References Cited

U.S. PATENT DOCUMENTS 4,247,203 A 1/1981 Levy et al. .................... 356/398
4,758,094 A 7/1988 Wihl et al. .................... 356/394
6,614,520 B1 9/2003 Bareket et al. ............. 356/237.3
2004/0033635 A1* 2/2004 Madge et al. ................... 438/14
2006/0269118 A1 11/2006 Lee et al.
2008/0183412 A1* 7/2008 Funk et al. ...................... 702/97
2014/0294283 A1* 10/2014 Takeda et al. ................ 382/144

FOREIGN PATENT DOCUMENTS

WO WO 2009/007977 1/2009
WO 2009/083606 A1 7/2009 ................ G03F 7/20

OTHER PUBLICATIONS

Wikipedia.org: Average; http://en.wikipedia.org/w/index.php?title=Average&diff=266520692&oldid=266520477; Jan. 26, 2009.*

(Continued)

*Primary Examiner* — Bhavesh Mehta
*Assistant Examiner* — Andrew Moyer
(74) *Attorney, Agent, or Firm* — Fish & Richardson P.C.

(57) ABSTRACT

A method includes generating, using a data processor, information showing variations of a parameter across a photo mask relative to an average value of the parameter measured at various locations on the photo mask. For example, the information can include data points, and each data point can be determined based on a ratio between a measurement value and an average of a plurality of measurement values.

46 Claims, 8 Drawing Sheets

120

| | Point | | | |
|---|---|---|---|---|
| Die | A | B | C | D |
| 1 | $A^1/\bar{A}$ | $B^1/\bar{B}$ | $C^1/\bar{C}$ | $D^1/\bar{D}$ |
| 2 | $A^2/\bar{A}$ | $B^2/\bar{B}$ | $C^2/\bar{C}$ | $D^2/\bar{D}$ |
| 3 | $A^3/\bar{A}$ | $B^3/\bar{B}$ | $C^3/\bar{C}$ | $D^3/\bar{D}$ |
| 4 | $A^4/\bar{A}$ | $B^4/\bar{B}$ | $C^4/\bar{C}$ | $D^4/\bar{D}$ |
| 5 | $A^5/\bar{A}$ | $B^5/\bar{B}$ | $C^5/\bar{C}$ | $D^5/\bar{D}$ |
| 6 | $A^6/\bar{A}$ | $B^6/\bar{B}$ | $C^6/\bar{C}$ | $D^6/\bar{D}$ |

122

(56) References Cited

OTHER PUBLICATIONS

Wikipedia.org: Percentage; http://en.wikipedia.org/w/index.php?title=Percentage&diff=267545865&oldid=266376144; Jan. 31, 2009.*

A.K. Wong et al., "Linewidth variation characterization by special decomposition" *J Microlith., Microfab., Microsyst.*, vol. 1, No. 2, pp. 106-116, Jul. 2002.

International Search Report and Written Opinion dated Jul. 12, 2011 from corresponding application PCT/IB2011/000375.

Labovitz S et al.: "Detection of progressive transmission loss due to haze with Galileo(TM) mask DUV transmittance mapping based on non imaging optics," Proceedings of the SPIE, vol. 7122, Oct. 7, 2008.

Ben-Zvi G et al.: "Very high sensitivity mask transmittance mapping and measurements based on non imaging optics with Galileo(TM)," Apr. 18, 2008, Proceedings of SPIE, vol. 7028.

Steven Labovitz et al., "Detection of Progressive Transmission Loss Due to Haze with Galileo™ Mask DUV Transmittance Mapping Based on Non Imaging Optics", *BACUS Symposium on Photomask Technology*, vol. 7122, No. 2, (Oct. 7-10, 2008), Monterey, California, USA.

* cited by examiner

110

Field Map

| | Point | | | |
|---|---|---|---|---|
| Die | A | B | C | D |
| 1 | $A^1$ | $B^1$ | $C^1$ | $D^1$ |
| 2 | $A^2$ | $B^2$ | $C^2$ | $D^2$ |
| 3 | $A^3$ | $B^3$ | $C^3$ | $D^3$ |
| 4 | $A^4$ | $B^4$ | $C^4$ | $D^4$ |
| 5 | $A^5$ | $B^5$ | $C^5$ | $D^5$ |
| 6 | $A^6$ | $B^6$ | $C^6$ | $D^6$ |
| Avg | $\bar{A}$ | $\bar{B}$ | $\bar{C}$ | $\bar{D}$ |

| | Point | | | |
|---|---|---|---|---|
| Die | A | B | C | D |
| 1 | $A^1/\bar{A}$ | $B^1/\bar{B}$ | $C^1/\bar{C}$ | $D^1/\bar{D}$ |
| 2 | $A^2/\bar{A}$ | $B^2/\bar{B}$ | $C^2/\bar{C}$ | $D^2/\bar{D}$ |
| 3 | $A^3/\bar{A}$ | $B^3/\bar{B}$ | $C^3/\bar{C}$ | $D^3/\bar{D}$ |
| 4 | $A^4/\bar{A}$ | $B^4/\bar{B}$ | $C^4/\bar{C}$ | $D^4/\bar{D}$ |
| 5 | $A^5/\bar{A}$ | $B^5/\bar{B}$ | $C^5/\bar{C}$ | $D^5/\bar{D}$ |
| 6 | $A^6/\bar{A}$ | $B^6/\bar{B}$ | $C^6/\bar{C}$ | $D^6/\bar{D}$ |

ANALYSES OF MEASUREMENT DATA

CROSS-REFERENCE TO RELATED APPLICATIONS

This application is a national stage application of PCT/IB2011/000375, filed on Feb. 23, 2011, which claims priority to Provisional Application No. 61/307,284, filed on Feb. 23, 2010, hereby incorporated by reference in its entirety.

TECHNICAL FIELD

This subject matter is generally related to analyses of measurement data.

BACKGROUND

In semiconductor lithography, it is useful to inspect and monitor photo masks (also referred to as reticles) and semiconductor wafers having circuits printed on the wafers based on the patterns on the photo masks. In some examples, images of portions of a photo mask currently being used for production of semiconductor circuits are compared to images of portions of a reference photo mask, and differences between the images are analyzed. In some examples, the photo mask has several regions with repeating patterns, each region having a pattern for one die, and the image of a region is compared to the image of another region of the same photo mask. Similarly, a production semiconductor wafer can be inspected by comparing images of dies on the production wafer with images of dies on a reference wafer, or an image of a die can be compared to the image of another die on the same wafer. The measurements of the photo masks and wafers can be used to generate information about the type and number of defects on the photo mask and wafer, which is useful for quality control.

SUMMARY

In general, in one aspect, a method includes generating, using a data processor, information showing variations of a parameter across a photo mask relative to an average value of the parameter measured at various locations on the photo mask.

Implementations of the method may include one or more of the following features. The information can be displayed. The information can include data points, and each data point can be determined based on a ratio between a measurement value and an average of a plurality of measurement values. The photo mask can include a plurality of regions having repeating patterns, and the average of a plurality of measurement values can be an average of values of measurements made at corresponding locations in the plurality of regions. Each region can include patterns associated with a semiconductor die or an array of pixels. The method can include measuring the parameter at one location in each of the plurality of regions, calculating an average of the measurement values for corresponding locations of the plurality of regions, and for each measurement value, calculating a ratio between the measurement value and the average. The method can include measuring the parameter at a plurality of locations in each of the plurality of regions, each location in any region having a corresponding location in each of the other regions, for each group of corresponding locations in the plurality of regions, calculating an average of the measurement values for the group of corresponding locations, and for each location in the group, calculating a ratio between the measurement value of the location and the average of the measurement values for the group.

The photo mask can include n regions, each region can include two measurement locations, the i-th region can have measurement locations L_ai and L_bi, the measurement values for the locations L_ai and L_bi can be Ai and Bi, respectively, the locations L_ai can form a first group of corresponding locations, the locations L_bi can form a second group of corresponding locations, the average measurement value for the first group of corresponding locations can be calculated as $$\overline{A} = \sum_{i=1}^{n} Ai/n,$$

the average measurement value for the second group of corresponding locations can be calculated as $$\overline{B} = \sum_{i=1}^{n} Bi/n,$$

with i being an integer ranging from 1 to n. The ratio for each location in the first group of corresponding locations can be calculated as $Ai/\overline{A}$, and the ratio for each location in the second group of corresponding locations can be calculated as $Bi/\overline{B}$. The photo mask can include n regions, each region can include m measurement locations, m and n being positive integers, the i-th region can have measurement locations L_ji (j=1 to m), the measurement value for the location L_ji can be Aji, and for each j, the locations L_ji (i=1 to n) can form a group of corresponding locations, the average measurement value for each group of corresponding locations can be $$\overline{A}_j = \sum_{i=1}^{n} Aji/n,$$

with i being an integer that ranges from 1 to n. For each j, the ratio for each location in the group of corresponding locations L_ji (i=1 to n) can be calculated as $Aji/\overline{A}_j$. The parameter can be, for example, transmittance, reflectance, or critical dimension. The method can include generating a distribution map based on the information, the distribution map showing a distribution of the variations of the parameter across the photo mask relative to the average value of the parameter. The method can include generating a scatter graph based on the information, the graph showing data points relative to axes, one of the axes representing the variations of the parameter across the photo mask relative to the average value of the parameter. The method can include modifying the transmittance at a location on the photo mask based on the information. The method can include adjusting dosage of illumination in a lithography system based on the information.

In general, in another aspect, a method includes generating, using a data processor, information showing variations of a parameter across a substrate relative to an average value of the parameter measured at various locations on the substrate.

Implementations of the method may include one or more of the following features. The method can include displaying the information. The information can show variations of a parameter across a semiconductor wafer or a flat panel display substrate. The information can include data points, and each data point can be determined based on a ratio between a measurement value and an average of a plurality of measurement values. The substrate can include a plurality of regions having repeating patterns, and the average of a plurality of measurement values can be an average of values of measurements made at corresponding locations in the plurality of regions. Each region can include a pattern associated with a semiconductor die or a display pixel. The method can include measuring the parameter at one location in each of the plurality of regions, calculating an average of the measurement values for corresponding locations of the plurality of regions, and for each measurement value, calculating a ratio between the measurement value and the average. The method can include measuring the parameter at a plurality of locations in each of the plurality of regions, each location in any region having a corresponding location in each of the other regions, for each group of corresponding locations in the plurality of regions, calculating an average of the measurement values for the group of corresponding locations, and for each location in the group, calculating a ratio between the measurement value of the location and the average of the measurement values for the group.

The substrate can include n regions, each region can include two measurement locations, the i-th region can have measurement locations L_ai and L_bi, the measurement values for the locations L_ai and L_bi can be Ai and Bi, respectively, the locations L_ai can form a first group of corresponding locations, the locations L_bi can form a second group of corresponding locations, the average measurement value for the first group of corresponding locations can be calculated as $$\overline{A} = \sum_{i=1}^{n} Ai/n,$$

the average measurement value for the second group of corresponding locations can be calculated as $$\overline{B} = \sum_{i=1}^{n} Bi/n,$$

with i being an integer ranging from 1 to n. The ratio for each location in the first group of corresponding locations can be calculated as $Ai/\overline{A}$, and the ratio for each location in the second group of corresponding locations can be calculated as $Bi/\overline{B}$. The substrate can include n regions, each region can include m measurement locations, m and n being positive integers, the i-th region can have measurement locations L_ji (j=1 to m), the measurement value for the location L_ji can be Aji, and for each j, the locations L_ji (i=1 to n) can form a group of corresponding locations, the average measurement value for each group of corresponding locations can be calculated as $$\overline{A}_j = \sum_{i=1}^{n} Aji/n,$$

with i being an integer that ranges from 1 to n. For each j, the ratio for each location in the group of corresponding locations L_ji (i=1 to n) can be calculated as $Aji/\overline{A}j$. The parameter can include transmittance, reflectance, or critical dimension. The method can include generating a distribution map based on the information, the distribution map showing a distribution of the variations of the parameter across the substrate relative to the average value of the parameter. The method can include generating a scatter graph based on the information, the scatter graph showing data points relative to axes, one of the axes representing the variations of the parameter across the substrate relative to the average value of the parameter.

In general, in another aspect, a method of inspecting a reticle having a plurality of regions includes: measuring a parameter at a first measurement point in a first region to generate a measurement value for the first measurement point; measuring the parameter at measurement points in other regions that correspond to the first measurement point to generate a measurement value for each of the measurement points in the other regions that correspond to the first measurement point; calculating, using a data processor, an average measurement value that represents an average of the measurement values for the first measurement point and the other measurement points that correspond to the first measurement point; for each measurement point, calculating a ratio between the measurement value at the measurement point and the average measurement value; and outputting the ratios.

Implementations of the method may include one or more of the following features. The method can include measuring the parameter at a plurality of additional measurement points in the first region to generate a plurality of measurement values; for each additional measurement point in the first region, measuring the parameter at corresponding measurement points in the other regions, and calculating an average measurement value that represents an average of the measurement values for the additional measurement point and other measurement points that correspond to the additional measurement point; for each of the additional measurement points and the other measurement points that corresponding to the additional measurement points, calculating a ratio between the measurement value at the measurement point and the corresponding average measurement value; and outputting the ratios for the additional measurement points and the other measurement points that correspond to the additional measurement points. Each region can include a pattern associated with a semiconductor die. The method can include generating a die-to-average-die variation distribution map representing a distribution of variations of measurement values at particular locations on the reticle relative to average values associated with the particular locations, in which the average value associated with a particular location can be determined based on an average of measurement values of the particular location and locations on other dies that correspond to the particular location. The parameter can include transmittance, reflectance, or a critical dimension of the reticle.

In general, in another aspect, a system includes a detection device configured to measure a parameter of a substrate; and a computing system configured to generate information showing variations of the parameter across a photo mask relative to an average value of the parameter measured at various locations on the photo mask. Implementations of the system may include one or more of the following features. The substrate can include a photo mask, a semiconductor wafer, or a flat panel display substrate. The computing system is configured to calculate, for each of a plurality of measurement values, a ratio between the measurement value and an average of the plurality of measurement values. The substrate can include a plurality of regions having repeating patterns, and an average of a plurality of measurement values can include an average of values of measurements made at corresponding locations in the plurality of regions. Each region can include patterns associated with at least one of a semiconductor die or a display pixel. The detection device can be configured to measure the parameter at one location in each of the plurality of regions, and the computing system can be configured to calculate an average of the measurement values for corresponding locations of the plurality of regions, and for each measurement value, calculate a ratio between the measurement value and the average. The detection device can be configured to measure the parameter at a plurality of locations in each of the plurality of regions, each location in any region having a corresponding location in each of the other regions, and the computing system can be configured to, for each group of corresponding locations in the plurality of regions, calculate an average of the measurement values for the group of corresponding locations, and for each location in the group, calculate a ratio between the measurement value of the location and the average of the measurement values for the group.

The substrate can include n regions, each region can include two measurement locations, the i-th region can have measurement locations L_ai and L_bi, the measurement values for the locations L_ai and L_bi can be Ai and Bi, respectively, the locations L_ai can form a first group of corresponding locations, the locations L_bi can form a second group of corresponding locations, the average measurement value for the first group of corresponding locations can be calculated as $$\overline{A} = \sum_{i=1}^{n} Ai/n,$$

and the average measurement value for the second group of corresponding locations can be calculated as $$\overline{B} = \sum_{i=1}^{n} Bi/n,$$

with i being an integer ranging from 1 to n. The ratio for each location in the first group of corresponding locations can be calculated as $Ai/\overline{A}$, and the ratio for each location in the second group of corresponding locations can be calculated as $Bi/\overline{B}$. The substrate can include n regions, each region can include m measurement locations, m and n being positive integers, the i-th region can have measurement locations L_ji (j=1 to m), the measurement value for the location L_ji can be Aji, and for each j, the locations L_ji (i=1 to n) can form a group of corresponding locations, and the average measurement value for each group of corresponding locations can be calculated as $$\overline{A}_j = \sum_{i=1}^{n} Aji/n,$$

with i being an integer that ranges from 1 to n. For each j, the ratio for each location in the group of corresponding locations L_ji (i=1 to n) can be calculated as $Aji/\overline{A}_j$. The parameter can include transmittance, reflectance, or critical dimension. The system can include a user interface for providing a distribution map generated based on the information, the distribution map showing a distribution of the variations of the parameter across the substrate relative to the average value of the parameter. The system can include a user interface for providing a scatter graph generated based on the information, the scatter graph showing data points relative to axes, one of the axes representing the variations of the parameter across the substrate relative to the average value of the parameter.

In general, in another aspect, an apparatus includes a computer storage medium storing instructions that, when executed by data processing apparatus, cause the data processing apparatus to perform operations comprising: generating information showing variations of a parameter across a substrate relative to an average value of the parameter measured at various locations on the substrate.

BRIEF DESCRIPTION OF DRAWINGS

FIG. 2 is a field map.

FIG. 3 is a transmittance uniformity distribution map.

DETAILED DESCRIPTION

A system is provided for generating a transmission uniformity map of a photo mask representing variations of the transmittance across the photo mask. The transmission map can be used to determine the quality of the photo mask, for example, for determining whether the photomask should be cleaned or replaced. The photo mask can have patterns for n dies (n preferably not less than four) in which the pattern for one die is repeated for the other dies. The variations in the transmittance can be expressed as percentage values, in which each value is calculated according to a ratio between a measurement value at a location on the mask for one die and an average value of measurements made at the location and corresponding locations on the mask for all the dies. The ratio is referred to as a "die-to-average-die" value. A map of die-to-average-die values representing variations in the transmittance across the photo mask is useful in accurately detecting defects or potential defects in the photo mask. The photo mask and the lithography projection system can be adjusted to compensate for the measured variances in transmittance of the photo mask.

Figure 1:
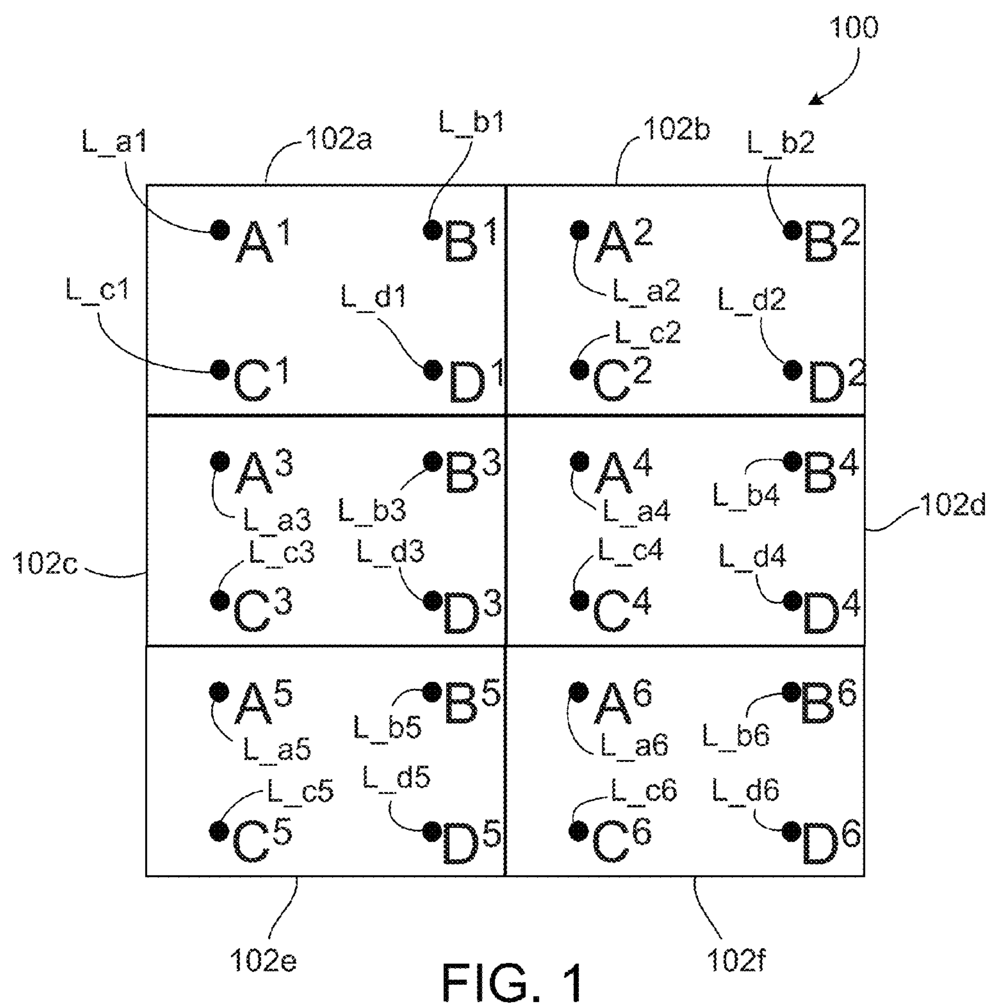
FIG. 1 is a diagram of an example photo mask.

Referring to FIG. 1, an example photo mask 100 includes six regions 102*a*, 102*b*, 102*c*, 102*d*, 102*e*, 102*f* (collectively referenced as 102) each having patterns for one die on a semiconductor wafer. In this example, it is assumed that the pattern of any region 102 is designed to be the same as the pattern of any other region 102. Each region 102 includes, for example, four measurement points L_a, L_b, L_c, and L_d, in which each measurement point is associated with a particular pattern. Each measurement point is shown as a round dot in the figure. Measurement points can be selected based on patterns that are unique and easily identifiable. The measurement points in the region 102*a* are L_a1, L_b1, L_c1, and L_d1; the measurement points in the region 102*b* are L_a2, L_b2, L_c2, and L_d2; the measurement points in the region 102*c* are L_a3, L_b3, L_c3, and L_d3; the measurement points in the region 102*d* are L_a4, L_b4, L_c4, and L_d4; the measurement points in the region 102*e* are L_a5, L_b5, L_c5, and L_d5; and the measurement points in the region 102*f* are L_a6, L_b6, L_c6, and L_d6.

It is assumed that the pattern at a measurement point in any region 102 is designed to be the same as the pattern at a corresponding measurement point in any other region 102. For example, the pattern at the measurement point L_a1 is designed to be the same as the pattern at any of the measurement points L_a1 (i=2 to 6). Similarly, the pattern at the measurement point L_b1 is designed to be the same as the pattern at any of the measurement points L_bi (i=2 to 6), and so forth. It is assumed that the transmittance is designed to be uniform among all corresponding measurement points across the photo mask. For example, the transmittance at measurement point L_a1 is designed to be the same as the transmittance at measurement point L_a1 (i=2 to 6), the transmittance at measurement point L_b1 is designed to be the same as the transmittance at measurement point L_b1 (i=2 to 6), and so forth. Different measurement points within the same region 102 may have different transmittance. For example, the transmittance at the measurement point L_a1 may be different from the transmittance at the measurement point L_b1.

To evaluate the quality of the photo mask in terms of uniformity, the transmittance at the 24 measurement points on the photo mask 100 are measured, and the measurement values Ai, Bi, Ci, and Di for measurement points L_ai, L_bi, L_ci, and L_di, respectively, i ranging from 1 to 6 are recorded. The average of the measurement values A1 to A6 is calculated: $\overline{A}$=(A1+A2+A3+A4+A5+A6)/6. The other average values $\overline{B}$, $\overline{C}$, and $\overline{D}$ are calculated in a similar manner. The average values $\overline{A}$, $\overline{B}$, $\overline{C}$ and $\overline{D}$ represent an average region of the photo mask and can be used as references to which individual measurements are compared. The set of values $\overline{A}$, $\overline{B}$, $\overline{C}$ and $\overline{D}$ represent a virtual die that is called the “average die”. The virtual average die is then used as a reference die for calculating the deviation of each measurement point in the field from the nominal theoretical value of that point. Hence this procedure is called “die-to-average-die” calculation.

Referring to FIG. 2, a field map 110 includes transmittance measurement values 112 Ai, Bi, Ci, and Di for the measurement points L_ai, L_bi, L_ci, and L_di (i=1 to 6), respectively. The field map 104 provides information about the distribution of the transmittance across the photo mask.

Referring to FIG. 3, a transmittance uniformity distribution map 120 includes die-to-average-die values 122 Ai/$\overline{A}$, Bi/$\overline{B}$, Ci/$\overline{C}$, and Di/$\overline{D}$ for the measurement points L_ai, L_bi, L_ci, and L_di (i=1 to 6), respectively. Each die-to-average-die value is a unit-less value that represents a percentage change in the transmittance at a location relative to a reference transmittance (i.e., the average transmittance). For a perfect photo mask in which the transmittance at all corresponding measurement points are the same, the die-to-average-die values will all be 100%. However, due to critical dimension uniformity (CDU) defects, transmission uniformity defects or haze on the photo mask or other factors, such as defects in the pellicle protecting the photo mask or impurities attached to the surfaces of the photo mask and the pellicle, the die-to-average-die values may vary from one measurement point to another.

It is easier to identify variations in transmittance that may be of significance using the die-to-average-die values than other methods, such as using die-to-die difference values, which represent differences in the measurement values. Each die-to-average-die value represents a percentage change from the reference value (i.e., the average value), so the variations in transmittance within a die or region are normalized. In some examples, the percentage change from a reference value may be more useful than the absolute amount of change from the reference value.

For example, in a die-to-die comparison, the difference values such as A1-A2, A2-A3, A3-A4, B1-B2, B2-B3, B3-B4, C1-C2, C2-C3, C3-C4, D1-D2, D2-D3, and D3-D4 are calculated. These difference values represent changes of transmittance from one region to another, and can be useful in providing insight to local trends on the photo mask. Due to variations in the patterns on the photo mask, the transmittance at the measurement point L_a may be higher than the transmittance at the measurement point L_b. A small percentage of variation at the measurement point L_a in one die may generate a large die-to-die difference in transmittance, while a large percentage of variation at the measurement point L_b in one die may generate a small die-to-die difference in transmittance. The relative (percentage) deviations of local transmission values as calculated by the die-to-average-die method is especially useful in situations of low signal-to-noise-ratio where the value of the measurand is on the same scale as the value of the deviations of the measurand because any stochastic signals are filtered out by the averaging process.

By using the die-to-average-die ratios, the difference in the higher transmittance at the measurement point L_a and the lower transmittance at the measurement point L_b are accounted for. The small percentage variation at the measurement point L_a will result in a small die-to-average-die value, and the large percentage variation at the measurement point L_b will result in a large die-to-average-die value.

In some examples, die-to-die comparisons provide information on local variations of the measurand. For example, suppose two corresponding measurement points in the upper left portion of a photo mask have transmittance values 0.64 and 0.66, and two corresponding measurement points in the lower right portion of the photo mask have transmittance values 0.54 and 0.56. The differences between the transmittance at the two measurement points in the upper left portion and between the transmittance at the two measurement points in the lower right portion are both 0.02. The die-to-die analysis provides information on the variations within the upper left region and variations within the lower right region, but does not provide information about the variations between the upper left region and the lower right region.

By contrast, because the average values in die-to-average-die analysis are generated based on measurements distributed across the photo mask, the die-to-average-die values provide insight to global trends across the photo mask. In the example above, assuming that the average transmittance value is 0.6, the transmittance die-to-average-die values are 106% and 110% for the two measurement points in the upper left portion, and 90% and 93% for the two measurement points in the lower right portion. Not only can one see local transmittance variations (for example, from 106% to 110% in the upper left portion or from 90% to 93% in the lower right portion), one can also see global transmittance variations (for example, from 110% in the upper left portion to 90% in the lower right portion), assuming all four measurement points have the same theoretical transmission.

Figure 4:
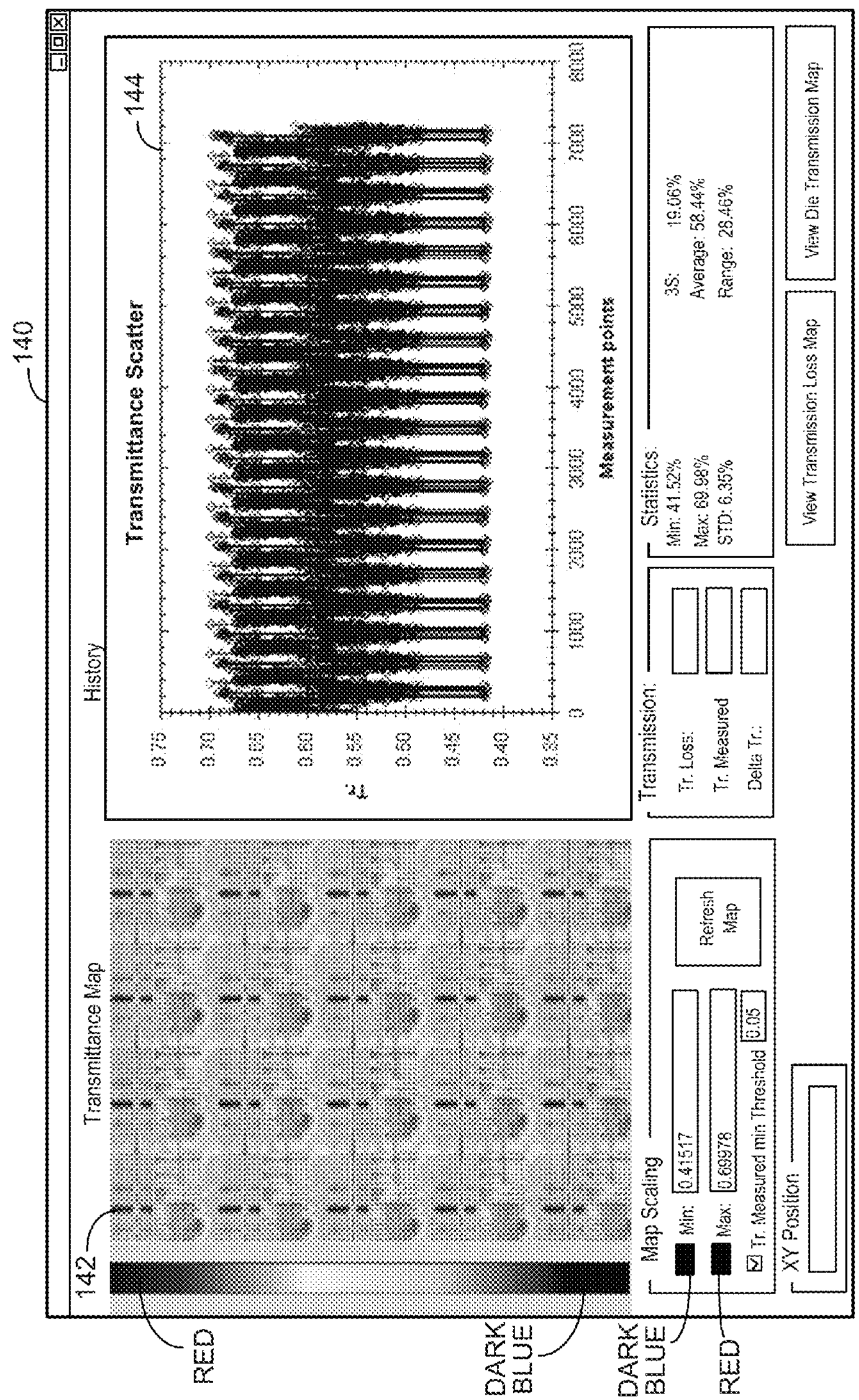
FIG. 4 is a diagram of a graphical user interface.
Figure 5:
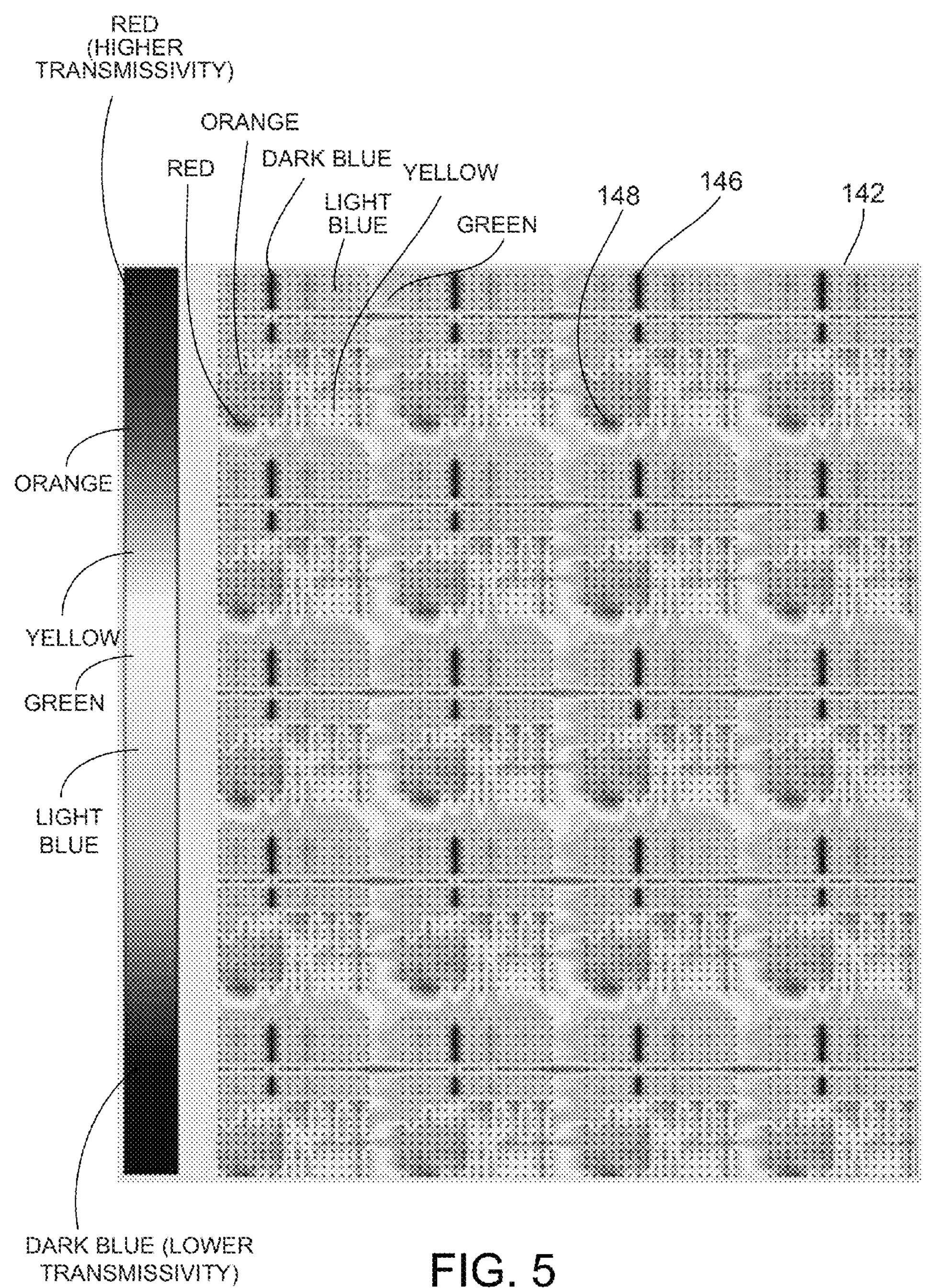
FIG. 5 is a transmission map.

Referring to FIG. 4, in some implementations, the system may provide a graphical user interface 140 that shows a transmittance map 142 and a transmittance scatter graph 144 representing the transmittance measured over different areas of the photo mask. FIG. 5 is an enlarged version of the transmission map 142. The transmission map 142 can be shown in color (which is represented in gray scale in the figure). In this example, the photo mask has an array of 20 regions, including 5 rows and 4 columns of regions. The map

142 and the graph 144 indicate that the transmittance of the photo mask ranges from 0.41517 (represented in blue) to 0.69978 (represented in red).

The transmission map 142 and the transmission scatter graph 144 provide information about a distribution of the transmittance across the photo mask. Referring to FIG. 5, the map 142 shows that each region has sub-regions 146 having lower transmittance and sub-regions 148 having higher transmittance. Based on the transmission map 142 and the transmission scatter graph 144 alone, it may be difficult to determine whether the variations in the transmittance are due to differences in the pattern to in the original design of the photo mask, or due to other factors (such as critical dimension uniformity defects, transmission uniformity defects, haze, or impurities) in the photo mask.

Figure 6:
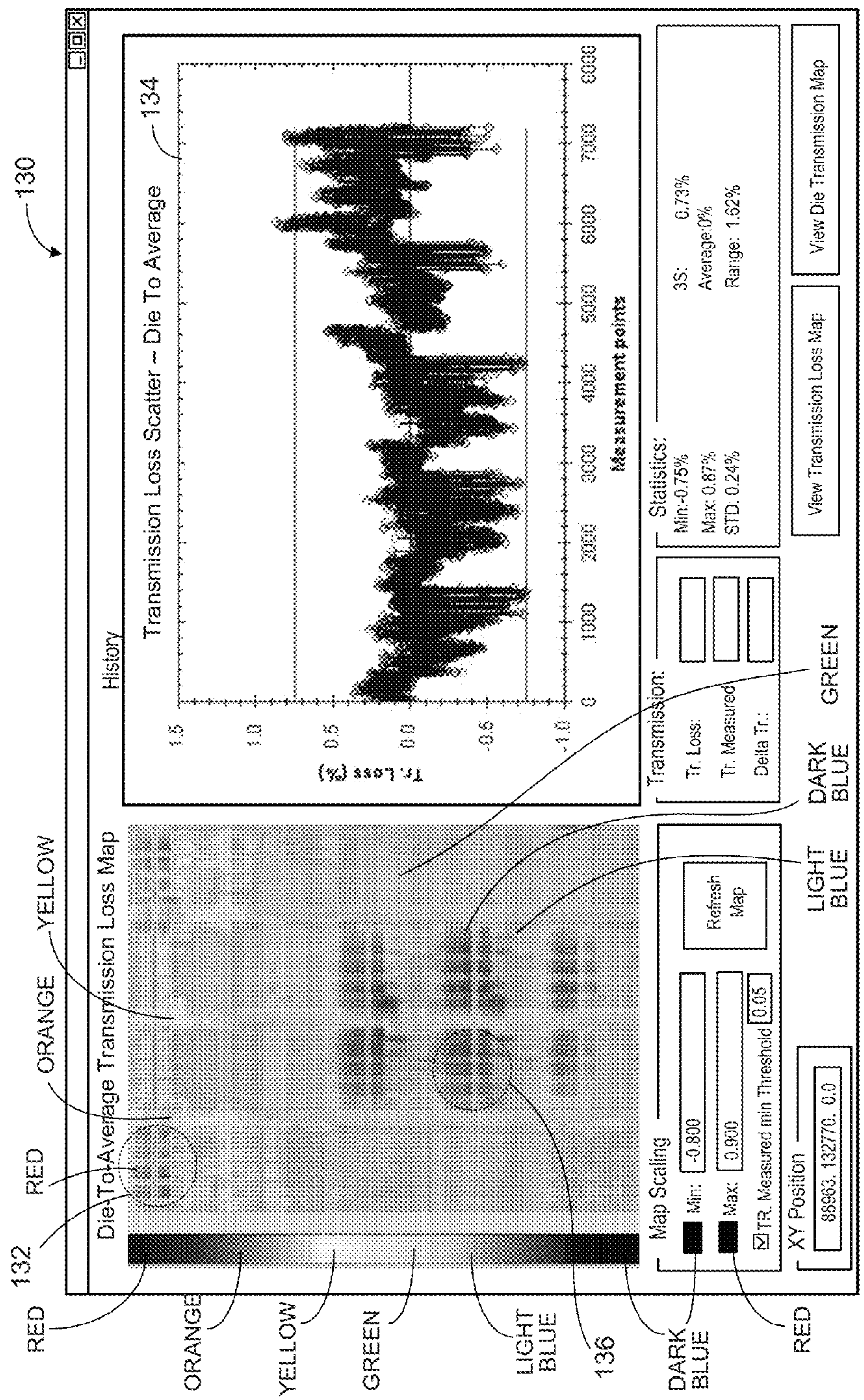
FIG. 6 is a diagram of a graphical user interface.
Figure 7:
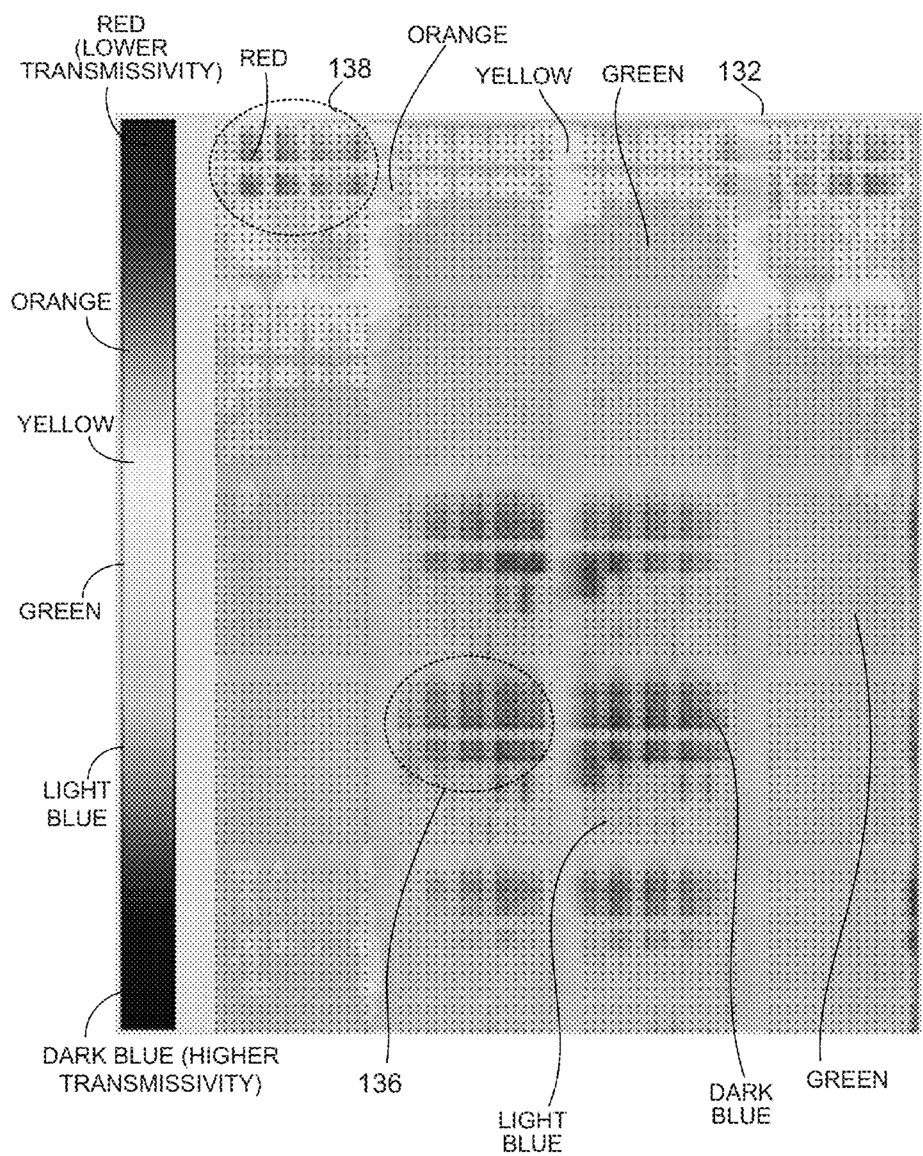
FIG. 7 is a transmission uniformity map.

Referring to FIG. 6, in some implementations, the system may provide a graphical user interface 130 that shows a die-to-average-die transmission uniformity map 132 and a die-to-average-die transmission uniformity scatter graph 134. FIG. 7 is an enlarged version of the die-to-average-die transmission uniformity map 132. The transmission uniformity map 132 can be shown in color (which is represented in gray scale in the figure). The map 132 and the graph 134 are generated using the same underlying data as the map 142 and the graph 144 (FIG. 4), except that die-to-average-die values are used for the map 132 and the graph 134. From the map 132 and the graph 134, one can observe global behavior and local variation of transmission uniformity that were previously hidden in the map 142 and the graph 144 due to differences in the patterns at different sampling points.

The die-to-average-die transmission uniformity map 132 and the die-to-average-die transmittance uniformity scatter graph 134 show the distribution of transmission uniformity (as a percentage of the average value) across the photo mask. The map 132 and the graph 134 can provide a global view of the variations of transmittance uniformity across the entire photo mask.

The die-to-average-die transmission uniformity can be calculated based on the difference between each individual measurement value and the average measurement value, divided by the average measurement value. The die-to-average-die transmission uniformity is equal to 1 minus the transmission die-to-average-die value. In the example of FIG. 3, the transmission die-to-average-die uniformity values can be represented as $(\overline{A}-A1)/\overline{A}$ or $1-A1/\overline{A}$, $(\overline{B}-B1)/\overline{B}$ or $1-B1/\overline{B}$, and so forth. Note that in this example, a positive transmission uniformity value indicates that the transmittance at a measurement point is lower than average.

In the example of FIG. 6, the die-to-average-die transmission uniformity ranges from −0.8% (represented in dark blue) to 0.9% (represented in red). A −0.8% transmission uniformity indicates that the transmittance at a particular measurement point is more than the average value by 0.8%. The map 132 indicates that regions 136 near the center of the photo mask has slightly higher transmittance than average, and regions 138 near the top of the photo mask has slightly lower transmittance than average.

The terms "center" and "top" refer to relative positions of portions of the photo mask as shown in the figures, and do not necessarily refer to relative positions of portions of the photo mask during use.

The map 132 and the graph 134 can be useful in determining the uniformity quality of the photo mask. For example, the user may determine that a photo mask needs to be cleaned if a portion of the photo mask has transmittance variations greater than a first threshold. The user may determine that the photo mask should be replaced if a portion of the photo mask has transmittance variations greater than a second threshold.

A series of the map 132 and the graph 134 can be generated over a period of time to determine changes in properties of the photo mask over time. In some examples, a photo mask can be made by coating layers of chrome (Cr), molybdenum silicide (MoSi), and anti-reflective material on a blank quartz plate, and etching the coatings to form patterns on the photo mask. The transmission of a photo mask can be affected by many factors, for example: (1) quartz raw material non-homogeneity; (2) contamination by haze growth on any of the surfaces of the quartz plate, the coatings, or pellicle; (3) contamination by metal and oxide ions absorbed in the quartz plate and adsorbed on the quartz surface during mask manufacturing; (4) photochemical degradation of the pellicle and fused silica substrates; and (5) degradation of absorber thickness, particularly of MoSi, due to clean processes. Accumulated contributions of all the factors may give rise to several percents of transmission variation. Every percent of exposure dose change may result in 1 to 2 nm critical dimension change on the wafer depending on exposure and process conditions.

By examining a series of the die-to-average-die transmission uniformity maps generated over time, a user can determine whether the quality of the photo mask has deteriorated and may need immediate attention, such as cleaning or replacement. For example, when a photo mask is initially examined, the lithography system may be adjusted to compensate for variations in the transmittance across the photo mask. If the variations in transmittance of the photo mask change over time, then the initial adjustments made to the lithography system may not properly compensate for the variations in transmittance across the photo mask.

In some implementations, the map 132 and the graph 134 can be used to modify the photo mask to reduce defects. For example, a photo mask can be modified by using a laser beam to vary the optical properties of certain coatings at specific regions to change the transmittance at the specific regions or a laser beam can be used for modifying the transmittance of the bulk fused silica of the mask itself, for example, with the CD Control (CDC) tool available from Carl Zeiss SMS GmbH, Jena, Germany. The map 132 and the graph 134 can also be used to adjust the dosage of illumination used to expose photo resists according to the patterns on the photo mask.

The transmittance at the measurement points of the photo mask can be measured using, for example, a non-imaging tool configured such that an image is not formed at a detector. The non-imaging tool can measure the transmittance of a beam having a large spot size, in which the average transmittance over the area of the spot is measured. An example non-imaging tool for measuring the transmittance of a photo mask is Carl Zeiss Galileo® tool, available from Carl Zeiss SMS GmbH, Jena, Germany. By using a non-imaging detection method, the transmittance can be measured using a fast and sensitive detection device, such as a photodiode, a photomultiplier tube (PMT), or a phototube. The detection device can have a wide dynamic range of more than five orders of magnitude and a high level of signal-to-noise ratio. Each measurement using the detection device may take a fraction of a second, and averaging several measurements can increase the signal-to-noise ratio to accuracy levels of about 0.1% transmittance or better. High accuracy of transmittance variation measurements can be transformed to a critical dimension distribution map according to a linear ratio that is found to exist between critical dimension variations and transmittance variations, as described in PCT application PCT/EP2009/050004, filed on Jan. 2, 2009, herein incorporated by reference.

The die-to-average-die technique can be used in analyzing properties of a photo mask other than transmittance, such as reflectance or critical dimension. The critical dimension refers to the dimension of a critical feature on the photo mask, such as a minimum line width. There can be several critical features on the photo mask.

The die-to-average-die technique can also be used in analyzing optical, electrical, or mechanical properties of a semiconductor wafer having repeating patterns. The wafer may include electronic components (for example, transistors, resistors, capacitors, conductive lines), optical components (for example, wave guides, light emitters, light sensors), and/or mechanical components (for example, micro-electro-mechanical system (MEMS) accelerometers or mirrors of a digital micromirror device).

Parameters that can be measured can include, for example, reflectance, critical dimension, electrical resistance, leakage current, and concentration of dopants. The critical dimension refers to the dimension of a critical feature on the wafer, such as a minimum line width. There can be several critical features on the wafer.

In general, the technique discussed above can be used to analyze any field (such as a photo mask or wafer) that has multiple sub fields (such as regions of the photo mask or dies on the wafer) that are identical, the sub fields having theoretically identical distributions of measurement points, and the repeating measurement points have the same target property (such as transmittance or critical dimension). It is preferable to have four or more sub-fields.

In some implementations, the die-to-average-die technique can be applied to analyzing photo masks that have patterns that are not necessarily used for fabricating circuits on dies of a wafer. For example, a photo mask for generating patterns on a substrate of a flat panel display can be analyzed using a similar technique. The photo mask can be divided into several regions, and each region can include, for example, patterns for n×m pixels, n and m being integers. The variations of a property of the photo mask (for example, the transmittance, reflectivity, or critical dimension) can be expressed as percentage values each calculated according to a ratio between a measurement value at a measurement point of one region and an average value of measurements made at the measurement point and corresponding measurement points of all the regions on the photo mask.

Similarly, the die-to-average-die technique can be applied to analyzing any substrate that has patterns that repeat from one region to another. For example, the substrate of a flat panel display can be divided into several regions, each region including n×m pixels, n and m being integers. The variations of a property of the mask (for example, the transmittance or reflectivity) can be expressed as percentage values each calculated according to a ratio between a measurement value at a measurement point of one region and an average value of measurements made at the measurement point and corresponding measurement points of all the regions on the substrate.

In general, the die-to-average-die technique can be used to analyze any measurable property of a field that is divided into subfields. The term "die-to-average-die" refers generally to a percentage value calculated according to a ratio between a measurement value at a measurement point of a subfield and an average value of measurements made at the measurement point and corresponding measurement points of all the subfields. Depending on context, a die-to-average-die value can be based on a measurement of a property of, for example, a photo mask, a wafer, a flat panel display substrate, or another type of substrate that may or may not involve dies.

Figure 8:
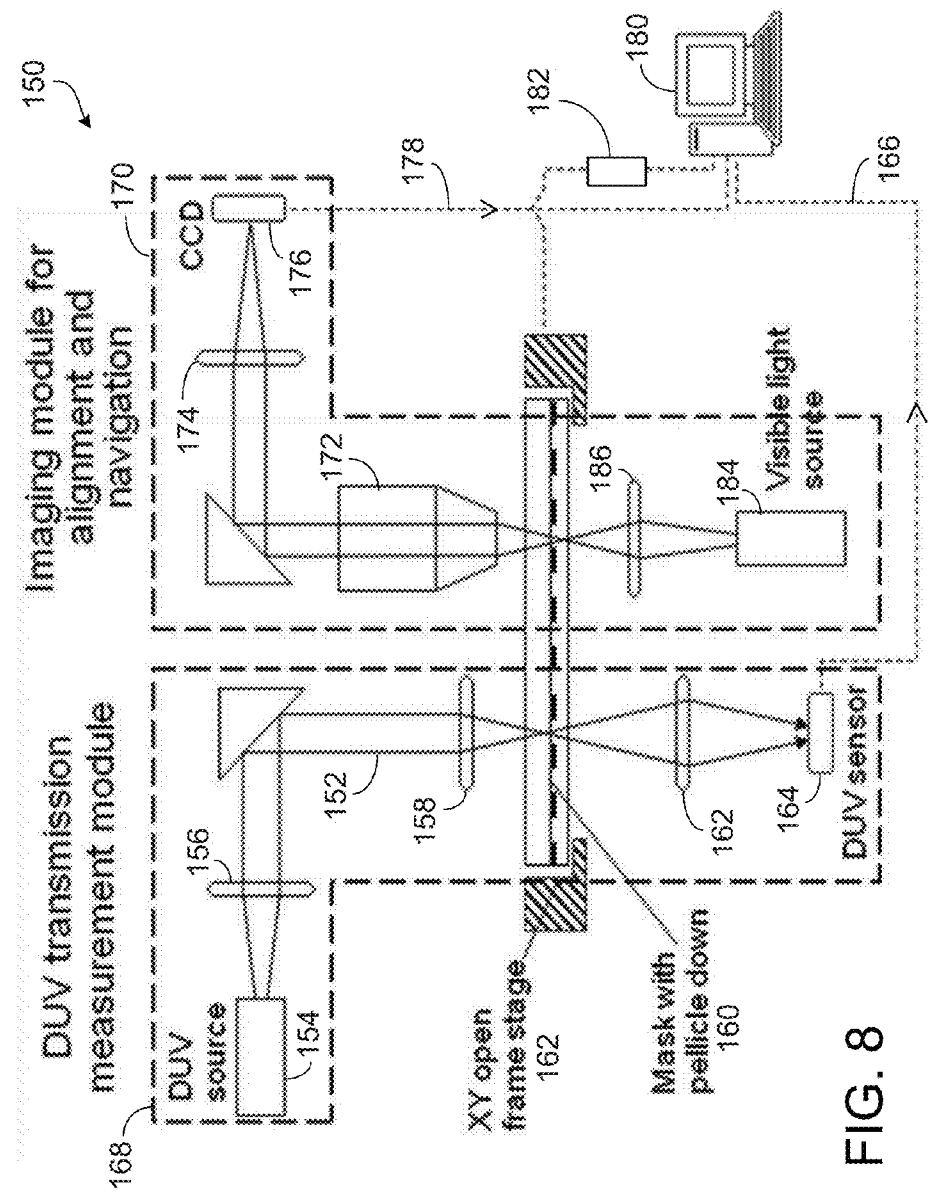
FIG. 8 is a diagram of an example measurement and mapping system.

FIG. 8 is a diagram of an example measurement and mapping system 150 for measuring and mapping the transmittance of a photo mask. The system 150 includes a deep ultraviolet (DUV) transmittance measurement module 168 and an imaging module for alignment and navigation 170. The DUV transmittance measurement module 168 includes a wideband DUV light source 154 that generates a DUV beam 152, which is collimated by a condenser lens 156. A second condenser lens 158 focuses the DUV beam 152 to a small spot size on the front side of a photo mask 160. The photo mask 160 is installed on a moving XY stage 162. A DUV illuminated spot is projected by a collecting lens 163 onto a fast DUV detector 164. Signals from the DUV detector 164 is transferred through a signal line 166 to a central computer 180 for data acquisition and mapping.

The imaging module 170 enables alignment and navigation across the photo mask 160. The imaging module 170 includes an objective lens 172, a tube lens 174, and a charged coupled device (CCD) camera 176. Images from the CCD camera 176 of alignment marks on the photo mask 160 at the focus of objective lens 172 are transferred through a signal line 178 to the central computer 180, and exact coordinates of all points are registered by stage control 182, for the full mapping process. The imaging module 170 receives the light for imaging from a light source 184, which is imaged to the objective lens 172 focal point by a condenser lens 186.

The measurement and mapping system 150 is a non-imaging tool. In general, a non-imaging tool is a tool in which a one-to-one correspondence between an object and an image does not exist. Since there is not a one-to-one correspondence between the object and the image, points of a source collected at a target plane are generally not distinguishable and an image is not formed at a detector. While, generally, in a non-imaging tool, an image is not formed at the detector, unintentional correspondence between an object and an image at the target plane may occur and/or a poor image could be formed. However, in the measurement and mapping system any such image would not be detected by the non-imaging detector or used to generate the transmittance or critical dimension distribution.

The signals from the DUV detector 164 are stored and processed by the computer 180 to calculate die-to-average-die values. The computer 180 provides a graphical user interface to show die-to-average-die maps. The system 150 may also be configured to measure other properties of the photo mask.

Figure 9:
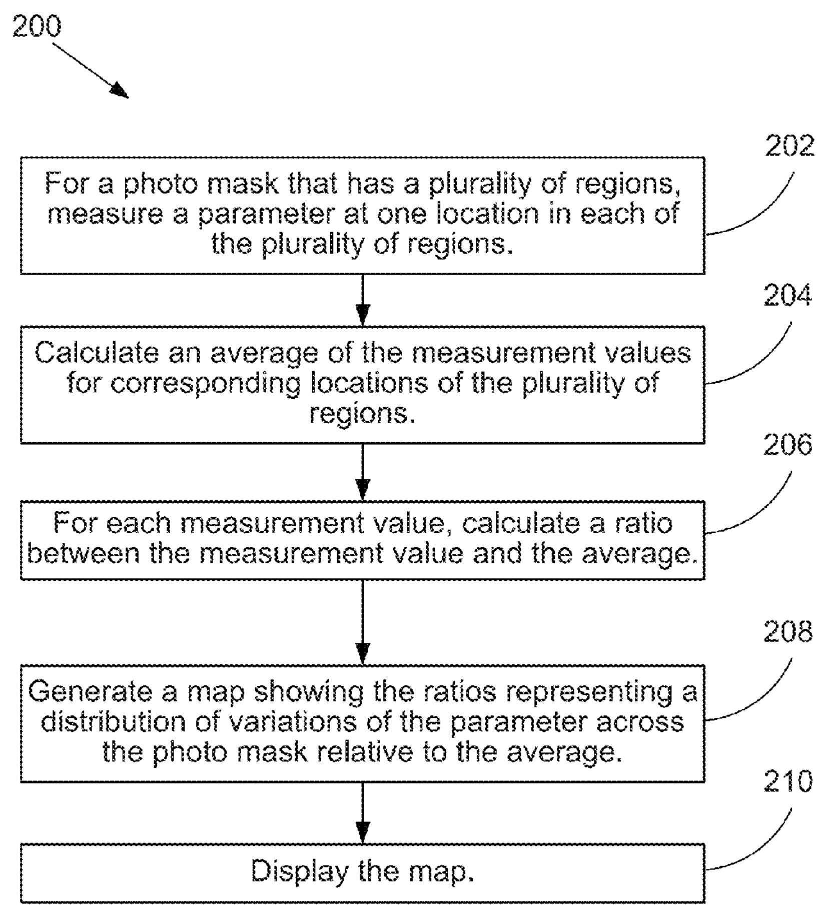
FIG. 9 is a flow diagram of an example process for evaluating a photo mask.

FIG. 9 is a flow diagram of an example process 200 for evaluating a photo mask that has a plurality of regions. For example, each region can have a pattern associated with a semiconductor die or an array of display pixels. In process 200, a parameter at one location in each of the plurality of regions is measured 202. For example, the parameter can be transmittance, reflectance, or critical dimension. The parameter can be measured using the detection device 164 of FIG. 8.

An average of the measurement values for corresponding locations of the plurality of regions is calculated 204. For example, the average can be calculated using the computer 180 of FIG. 8. If the measurement values are Ai, i being an integer ranging from 1 to n, n being the number of regions in the photo mask, the average measurement value for the corresponding locations can be calculated according to the formula $$\overline{A} = \sum_{i=1}^{n} Ai/n.$$

For each measurement value, a ratio between the measurement value and the average is calculated 206. For example, the ratio can be calculated according to the formula $Ai/\overline{A}$.

A map showing the ratios representing a distribution of variations of the parameter across the photo mask relative to the average is generated 208. For example, the map can be similar to the map 138 of FIG. 6.

The map is displayed 210. For example, the map can be shown in the user interface 130 of FIG. 6.

The features described above related to processing of data can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

The photo mask does not necessarily need to have patterns for several dies. For example, the photo mask can have a pattern for one die, in which the pattern has repeating features that have the same target properties (such as transmittance, reflectance, or critical dimension). For example, a large memory integrated circuit may have an array of memory cells, in which the memory circuit has repeating blocks of memory cells, and each block is almost identical to the other blocks. Each block can have several measurement points in which the transmittance at corresponding measurement points on different blocks have theoretical identical values. In the description above, the term "die" can refer to a region on the mask associated with an entire die or chip on a wafer, or a region on the mask that corresponds to a portion of the die or chip on the wafer (such as a portion of a memory cell). When there is only one measurement point in a region (for example, 102), the "die-to-average-die" method becomes a "point-to-average-point" method of determining the variations of a parameter. Accordingly, other implementations are within the scope of the following claims.

The invention claimed is:

1. A method comprising:

generating, using a data processor, an average value of a parameter measured at various locations on a photo mask; and generating, using the data processor, information showing variations of the parameter across the photo mask relative to the average value of the parameter;

wherein the information comprises data points, and each data point is determined based on a ratio between a measurement value and an average of a plurality of measurement values, and wherein the photo mask comprises a plurality of regions having repeating patterns, and the average of a plurality of measurement values comprises an average of values of measurements made at corresponding locations in the plurality of regions.

2. The method of claim 1, comprising displaying the information.

3. The method of claim 1 in which each region comprises patterns associated with a semiconductor die.

4. The method of claim 1 in which each region comprises patterns associated with an array of pixels.

5. The method of claim 1, comprising measuring the parameter at one location in each of the plurality of regions, calculating an average of the measurement values for corresponding locations of the plurality of regions, and for each measurement value, calculating a ratio between the measurement value and the average.

6. The method of claim 5, comprising measuring the parameter at a plurality of locations in each of the plurality of regions, each location in any region having a corresponding location in each of the other regions, for each group of corresponding locations in the plurality of regions, calculating an average of the measurement values for the group of corresponding locations, and for each location in the group, calculating a ratio between the measurement value of the location and the average of the measurement values for the group.

7. The method of claim 6 in which the photo mask comprises n regions, each region comprises two measurement locations, the i-th region has measurement locations L_ai and L_bi, the measurement values for the locations L_ai and L_bi are Ai and Bi, respectively, the locations L_ai form a first group of corresponding locations, the locations L_bi form a second group of corresponding locations, the average measurement value for the first group of corresponding locations $$\overline{A} = \sum_{i=1}^{n} Ai/n,$$

is the average measurement value for the second group of corresponding locations is $$\overline{B} = \sum_{i=1}^{n} Bi/n,$$

and i is an integer ranging from 1 to n.

8. The method of claim 7 in which the ratio for each location in the first group of corresponding locations comprises $Ai/\overline{A}$, and the ratio for each location in the second group of corresponding locations comprises $Bi/\overline{B}$.

9. The method of claim 6 in which the photo mask comprises n regions, each region comprises m measurement locations, m and n are positive integers, the i-th region has measurement locations L_ji (j=1 to m), the measurement value for the location L_ji is Aji, and for each j, the locations L_ji (i=1 to n) form a group of corresponding locations, the average measurement value for each group of corresponding locations is $$\overline{A}_j = \sum_{i=1}^{n} Aji/n,$$

and i is an integer that ranges from 1 to n.

10. The method of claim 9 in which for each j, the ratio for each location in the group of corresponding locations L_ji (i=1 to n) comprises $Aji/\overline{A}j$.

11. The method of claim 1 in which the parameter comprises at least one of transmittance, reflectance, or critical dimension.

12. The method of claim 1, comprising generating a distribution map based on the information, the distribution map showing a distribution of the variations of the parameter across the photo mask relative to the average value of the parameter.

13. The method of claim 1, comprising generating a scatter graph based on the information, the graph showing data points relative to axes, one of the axes representing the variations of the parameter across the photo mask relative to the average value of the parameter.

14. The method of claim 1, comprising modifying the transmittance at a location on the photo mask based on the information.

15. The method of claim 1, comprising adjusting dosage of illumination in a lithography system based on the information.

16. A method comprising:

generating, using a data processor, an average value of a parameter measured at various locations on a substrate; and generating, using the data processor, information showing variations of the parameter across the substrate relative to the average value of the parameter;

wherein the information comprises data points, and each data point is determined based on a ratio between a measurement value and an average of a plurality of measurement values, and wherein the substrate comprises a plurality of regions having repeating patterns, and the average of a plurality of measurement values comprises an average of values of measurements made at corresponding locations in the plurality of regions.

17. The method of claim 16, comprising displaying the information.

18. The method of claim 16 in which generating information comprises generating information showing variations of a parameter across at least one of a semiconductor wafer or a flat panel display substrate.

19. The method of claim 16 in which each region comprises a pattern associated with at least one of a semiconductor die or a display pixel.

20. The method of claim 16, comprising measuring the parameter at one location in each of the plurality of regions, calculating an average of the measurement values for corresponding locations of the plurality of regions, and for each measurement value, calculating a ratio between the measurement value and the average.

21. The method of claim 20, comprising measuring the parameter at a plurality of locations in each of the plurality of regions, each location in any region having a corresponding location in each of the other regions, for each group of corresponding locations in the plurality of regions, calculating an average of the measurement values for the group of corresponding locations, and for each location in the group, calculating a ratio between the measurement value of the location and the average of the measurement values for the group.

22. The method of claim 21 in which the substrate comprises n regions, each region comprises two measurement locations, the i-th region has measurement locations L_ai and L_bi, the measurement values for the locations L_ai and L_bi are Ai and Bi, respectively, the locations L_ai form a first group of corresponding locations, the locations L_bi form a second group of corresponding locations, the average measurement value for the first group of corresponding locations is $$\overline{A} = \sum_{i=1}^{n} Ai/n,$$

the average measurement value for the second group of corresponding locations is $$\overline{B} = \sum_{i=1}^{n} Bi/n,$$

and i is an integer ranging from 1 to n.

23. The method of claim 22 in which the ratio for each location in the first group of corresponding locations comprises $Ai/\overline{A}$, and the ratio for each location in the second group of corresponding locations comprises $Bi/\overline{B}$.

24. The method of claim 21 in which the substrate comprises n regions, each region comprises m measurement locations, m and n are positive integers, the i-th region has measurement locations L_ji (j=1 to m), the measurement value for the location L_ji is Aji, and for each j, the locations L_ji (i=1 to n) form a group of corresponding locations, the average measurement value for each group of corresponding locations is $$\overline{A}_j = \sum_{i=1}^{n} Aji/n,$$

and i is an integer that ranges from 1 to n.

25. The method of claim 24 in which for each j, the ratio for each location in the group of corresponding locations L_ji (i=1 to n) comprises $Aji/\overline{A}j$.

26. The method of claim 16 in which the parameter comprises at least one of transmittance, reflectance, or critical dimension.

27. The method of claim 16, comprising generating a distribution map based on the information, the distribution map showing a distribution of the variations of the parameter across the substrate relative to the average value of the parameter.

28. The method of claim 16, comprising generating a scatter graph based on the information, the scatter graph showing data points relative to axes, one of the axes representing the variations of the parameter across the substrate relative to the average value of the parameter.

29. A method of inspecting a reticle that includes a plurality of regions, the method comprising:

measuring a parameter at a first measurement point in a first region to generate a measurement value for the first measurement point;

measuring the parameter at measurement points in other regions that correspond to the first measurement point to generate a measurement value for each of the measurement points in the other regions that correspond to the first measurement point;

calculating, using a data processor, an average measurement value that represents an average of the measurement values for the first measurement point and the other measurement points that correspond to the first measurement point;

for each measurement point, calculating a ratio between the measurement value at the measurement point and the average measurement value; and outputting the ratios.

30. The method of claim 29, further comprising measuring the parameter at a plurality of additional measurement points in the first region to generate a plurality of measurement values;

for each additional measurement point in the first region, measuring the parameter at corresponding measurement points in the other regions, and calculating an average measurement value that represents an average of the measurement values for the additional measurement point and other measurement points that correspond to the additional measurement point;

for each of the additional measurement points and the other measurement points that corresponding to the additional measurement points, calculating a ratio between the measurement value at the measurement point and the corresponding average measurement value; and outputting the ratios for the additional measurement points and the other measurement points that correspond to the additional measurement points.

31. The method of claim 29 in which each region comprises a pattern associated with a semiconductor die.

32. The method of claim 31, comprising generating a die-to-average-die variation distribution map representing a distribution of variations of measurement values at particular locations on the reticle relative to average values associated with the particular locations, in which the average value associated with a particular location is determined based on an average of measurement values of the particular location and locations on other dies that correspond to the particular location.

33. The method of claim 29 in which the parameter comprises at least one of transmittance, reflectance, or a critical dimension of the reticle.

34. A system comprising:

a detection device configured to measure a parameter of a substrate; and a computing system configured to generate an average value of a parameter measured at various locations on the substrate; and generate information showing variations of the parameter across the substrate relative to the average value of the parameter;

wherein the information comprises data points, and each data point is determined based on a ratio between a measurement value and an average of a plurality of measurement values, and wherein the substrate comprises a plurality of regions having repeating patterns, and the average of a plurality of measurement values comprises an average of values of measurements made at corresponding locations in the plurality of regions.

35. The system of claim 34 in which the substrate comprises at least one of a photo mask, a semiconductor wafer, or a flat panel display substrate.

36. The system of claim 34 in which each region comprises patterns associated with at least one of a semiconductor die or a display pixel.

37. The system of claim 34 in which the detection device is configured to measure the parameter at one location in each of the plurality of regions, and the computing system is configured to calculate an average of the measurement values for corresponding locations of the plurality of regions, and for each measurement value, calculate a ratio between the measurement value and the average.

38. The system of claim 37 in which the detection device is configured to measure the parameter at a plurality of locations in each of the plurality of regions, each location in any region having a corresponding location in each of the other regions, and the computing system is configured to, for each group of corresponding locations in the plurality of regions, calculate an average of the measurement values for the group of corresponding locations, and for each location in the group, calculate a ratio between the measurement value of the location and the average of the measurement values for the group.

39. The system of claim 38 in which the substrate comprises n regions, each region comprises two measurement locations, the i-th region has measurement locations L_ai and L_bi, the measurement values for the locations L_ai and L_bi are Ai and Bi, respectively, the locations L_ai form a first group of corresponding locations, the locations L_bi form a second group of corresponding locations, the average measurement value for the first group of corresponding locations is $$\overline{A} = \sum_{i=1}^{n} Ai/n,$$

the average measurement value for the second group of corresponding locations is $$\overline{B} = \sum_{i=1}^{n} Bi/n,$$

and i is an integer ranging from 1 to n.

40. The system of claim 39 in which the ratio for each location in the first group of corresponding locations comprises $Ai/\overline{A}$, and the ratio for each location in the second group of corresponding locations comprises $Bi/\overline{B}$.

41. The system of claim 38 in which the substrate comprises n regions, each region comprises m measurement locations, m and n are positive integers, the i-th region has measurement locations L_ji (j=1 to m), the measurement value for the location L_ji is Aji, and for each j, the locations L_ji (i=1 to n) form a group of corresponding locations, the average measurement value for each group of corresponding locations is $$\overline{A}_j = \sum_{i=1}^{n} Aji/n,$$

and i is an integer that ranges from 1 to n.

42. The system of claim 41 in which for each j, the ratio for each location in the group of corresponding locations L_ji (i=1 to n) comprises $Aji/\overline{A}j$.

43. The system of claim 34 in which the parameter comprises at least one of transmittance, reflectance, or critical dimension.

44. The system of claim 34, comprising a user interface for providing a distribution map generated based on the information, the distribution map showing a distribution of the variations of the parameter across the substrate relative to the average value of the parameter.

45. The system of claim 34, comprising a user interface for providing a scatter graph generated based on the information, the scatter graph showing data points relative to axes, one of the axes representing the variations of the parameter across the substrate relative to the average value of the parameter.

46. An apparatus comprising:

a non-transitory computer storage medium storing instructions that, when executed by data processing apparatus, cause the data processing apparatus to perform operations comprising:

generating an average value of a parameter measured at various locations on a substrate; and generating information showing variations of the parameter across the substrate relative to the average value of the parameter;

wherein the information comprises data points, and each data point is determined based on a ratio between a measurement value and an average of a plurality of measurement values, and wherein the substrate comprises a plurality of regions having repeating patterns, and the average of a plurality of measurement values comprises an average of values of measurements made at corresponding locations in the plurality of regions.

* * * * *